(12) United States Patent
Levinson et al.

(10) Patent No.: US 7,199,994 B1
(45) Date of Patent: Apr. 3, 2007

(54) METHOD AND SYSTEM FOR FLATTENING A RETICLE WITHIN A LITHOGRAPHY SYSTEM

(75) Inventors: Harry Levinson, Saratoga, CA (US); Thomas White, Austin, TX (US)

(73) Assignee: Advanced Micro Devices Inc., Sunnyvale, CA (US)

( * ) Notice: Subject to any disclaimer, the term of this patent is extended or adjusted under 35 U.S.C. 154(b) by 513 days.

(21) Appl. No.: 10/755,731

(22) Filed: Jan. 12, 2004

(51) Int. Cl.
*H01T 23/00* (2006.01)

(52) U.S. Cl. ...................... 361/234; 361/233

(58) Field of Classification Search ......... 361/230–234
See application file for complete search history.

(56) References Cited

U.S. PATENT DOCUMENTS

| | | | | |
|---|---|---|---|---|
| 4,520,421 A | * | 5/1985 | Sakitani et al. | 361/234 |
| 4,692,836 A | * | 9/1987 | Suzuki | 361/234 |
| 5,880,923 A | * | 3/1999 | Hausmann | 361/234 |
| 6,538,873 B1 | * | 3/2003 | Larsen | 361/234 |
| 2002/0006556 A1 | * | 1/2002 | Gianoulakis et al. | 430/5 |
| 2003/0067734 A1 | * | 4/2003 | Nakano | 361/234 |

* cited by examiner

*Primary Examiner*—Stephen W. Jackson
*Assistant Examiner*—Danny Nguyen
(74) *Attorney, Agent, or Firm*—Monica H. Choi

(57) ABSTRACT

For clamping a reticle within a lithography system, a first area in the center of the reticle is clamped to a chuck of the lithography system at a first time point. In addition, a second area toward an outer perimeter of the reticle is clamped to the chuck at a second time point after the first time point such that the reticle is flattened against the chuck. With such flattening of the reticle, image placement error on a semiconductor substrate is minimized.

17 Claims, 5 Drawing Sheets

METHOD AND SYSTEM FOR FLATTENING A RETICLE WITHIN A LITHOGRAPHY SYSTEM

TECHNICAL FIELD

The present invention relates generally to integrated circuit fabrication, and more particularly, to flattening a reticle that is clamped to a chuck within a lithography system.

BACKGROUND OF THE INVENTION

Referring to FIG. 1, an EUV (extreme ultraviolet) lithography system 100 is used for patterning an IC (integrated circuit) material formed on a semiconductor substrate 102. The lithography system 100 includes a light source 104 that generates incident light 106 toward a reticle 108 clamped to a chuck 109. Portions of incident light 106 are reflected by the reticle 108 as reflected light 110 according to a pattern of the reticle 108. The reflected light 110 is projected through an image reduction system 112 onto the semiconductor substrate 102 for patterning the IC material thereon. Such components of the EUV lithography system 100 are known to one of ordinary skill in the art.

The reticle 108 may disadvantageously be clamped to the chuck 109 with a warped shape. For example in FIG. 1, the reticle 108 is clamped to the chuck 109 with a bowing out at the center. With such a warped shape, the incident light 106 is reflected from a bowing surface 114 of the reticle 108. However, such a warped shape contributes to an image placement error. Referring to FIG. 1, if the reticle 108 were clamped flat to the chuck 109, the incident light 106 would be reflected from a flat surface 116 (as illustrated by the dashed line in FIG. 1) to form another reflected light 118 (as illustrated by the dashed line in FIG. 1).

Referring to FIG. 1, the displacement between the reflected lights 110 and 118 forms an image placement error 120, ΔX. In addition, ΔZ is a peak to valley distance 122 which is a maximum distance between the bowed surface 114 and the theoretically flat surface 116 of the reticle. Furthermore, in the example of FIG. 1, the image reduction system 112 reduces the image size by 4:1, and θ° is an angle of incidence of the light 106 from the light source 104. In that case, the image placement error 120, ΔX, is expressed as follows:

$$\Delta X = (1/4) * \tan(\theta°) * \Delta Z$$

In addition, the curvature of the bowed surface 114 may further contribute to the image placement error 120, ΔX. To minimize the image placement error 120, ΔX, the reticle is desired to be flattened against the chuck 109 to minimize ΔZ and to minimize the curvature of the surface of the reticle 108.

SUMMARY OF THE INVENTION

Accordingly, in a general aspect of the present invention, variable locations of a reticle are clamped to a chuck at variable times in order to flatten the reticle during clamping of the reticle to the chuck.

In a method and system for clamping a reticle within a lithography system, a first area of the reticle is clamped to a chuck of the lithography system at a first time point. In addition, a second area of the reticle is clamped to the chuck at a second time point after the first time point such that the reticle is flattened against the chuck.

In an example embodiment of the present invention, the first area is toward a center of the reticle, and the second area is toward an outer perimeter of the reticle. When the reticle has a square shape, the first area is disposed toward a center of the reticle, and the second area is a frame disposed toward an outer perimeter of the reticle. In another example embodiment of the present invention, the first area is at a center of the reticle, and each of a plurality of frames of the reticle is clamped to the chuck successively in time from the center to the outer perimeter of the reticle.

In a further embodiment of the present invention, the chuck is an electrostatic chuck having a first pair of electrodes and a second pair of electrodes. In addition, the reticle has a first coating and a second coating. A voltage difference is applied across the first pair of electrodes facing the first coating at the first area of the reticle at the first time point for clamping the first area to the chuck. Also, a voltage difference is applied across the second pair of electrodes facing the second coating at the second area of the reticle at the second time point for clamping the second area to the chuck.

In yet another embodiment of the present invention, the lithography system uses extreme ultraviolet (EUV) light having a wavelength in a range of from about 110 Å to about 150 Å. Furthermore, light reflected from the reticle is used for patterning material on a semiconductor wafer within the lithography system of an example embodiment of the present invention.

In this manner, the reticle is flattened as the reticle is clamped to the chuck within the lithography system. Thus, image placement error on the semiconductor substrate is advantageously minimized.

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, and 13 refer to elements having similar structure and function.

DETAILED DESCRIPTION

Figure 2:
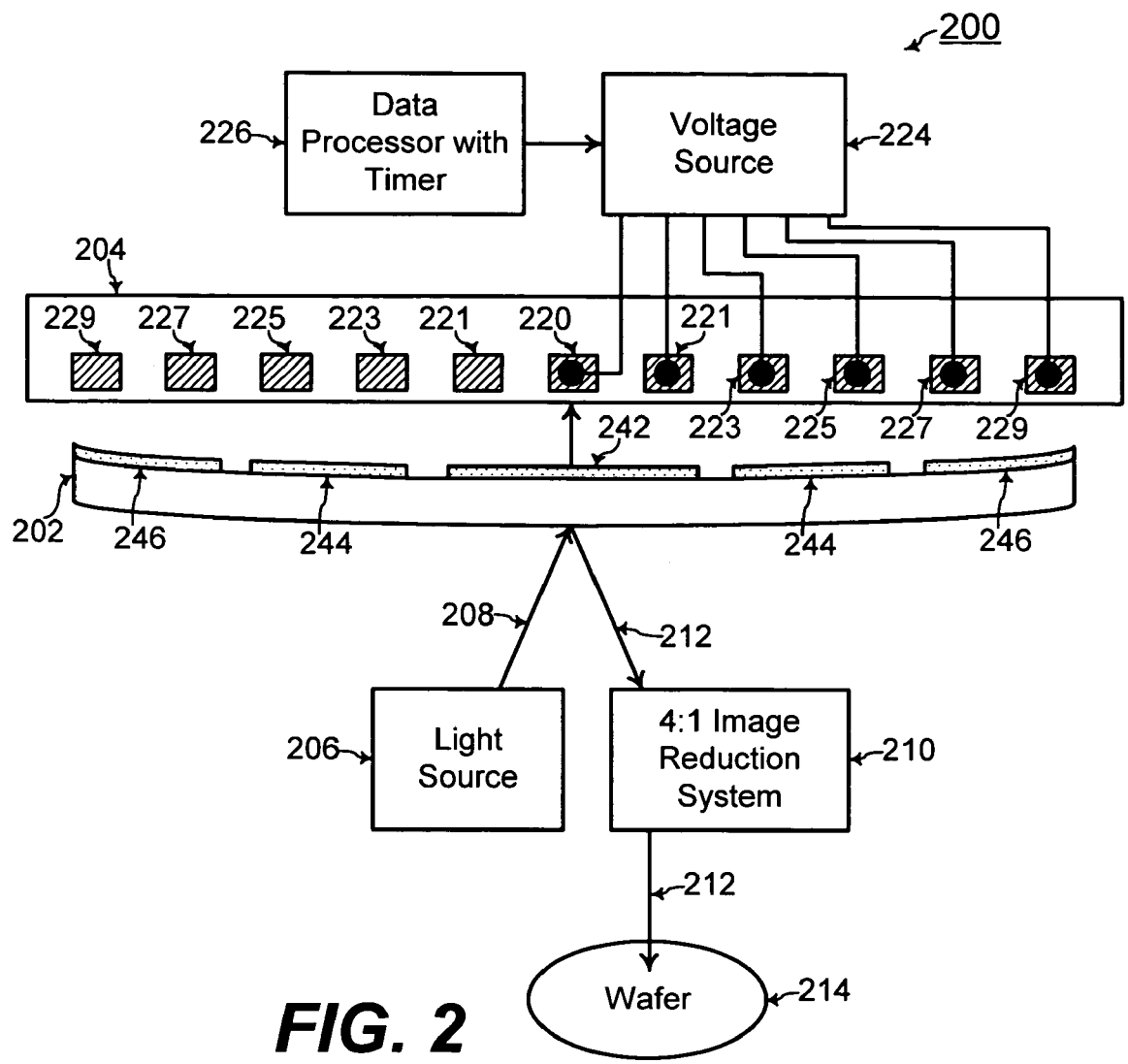
FIG. 2 shows a block diagram of a lithography system with components for flattening a reticle against a chuck, according to an embodiment of the present invention.

FIG. 2 shows a block diagram of a lithography system 200 for flattening a reticle 202 clamped to an electrostatic chuck 204, according to an embodiment of the present invention. The lithography system 200 includes a light source 206 used to generate incident light 208 toward the reticle 202. The light source 206 may generate light with a wavelength in a range of from about 110 Å (angstroms) to about 150 Å when the lithography system 200 is for EUVL (extreme ultraviolet light).

Figure 1:
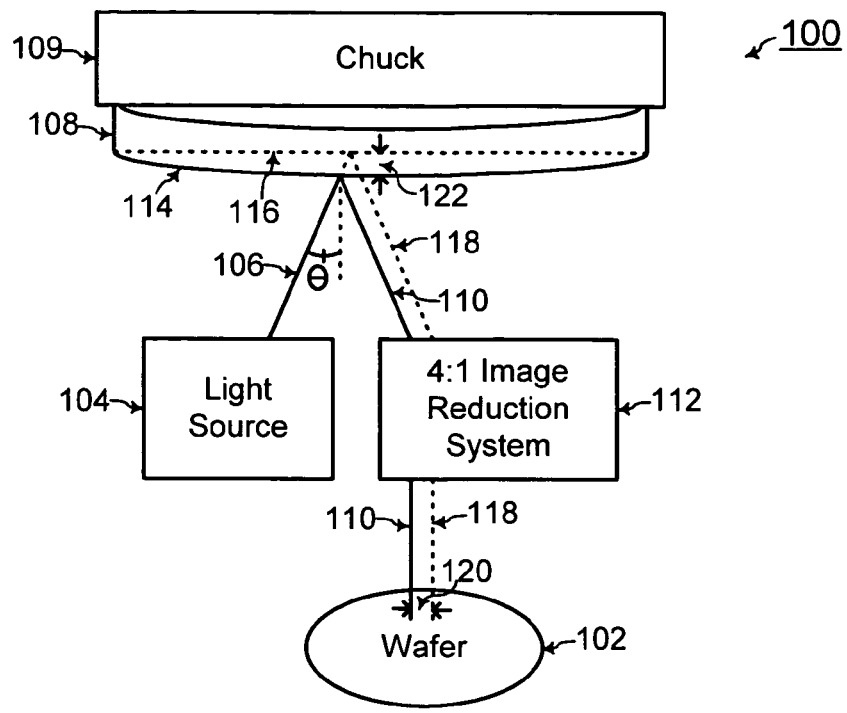
FIG. 1 shows a block diagram of a lithography system, according to the prior art.
Figure 3:
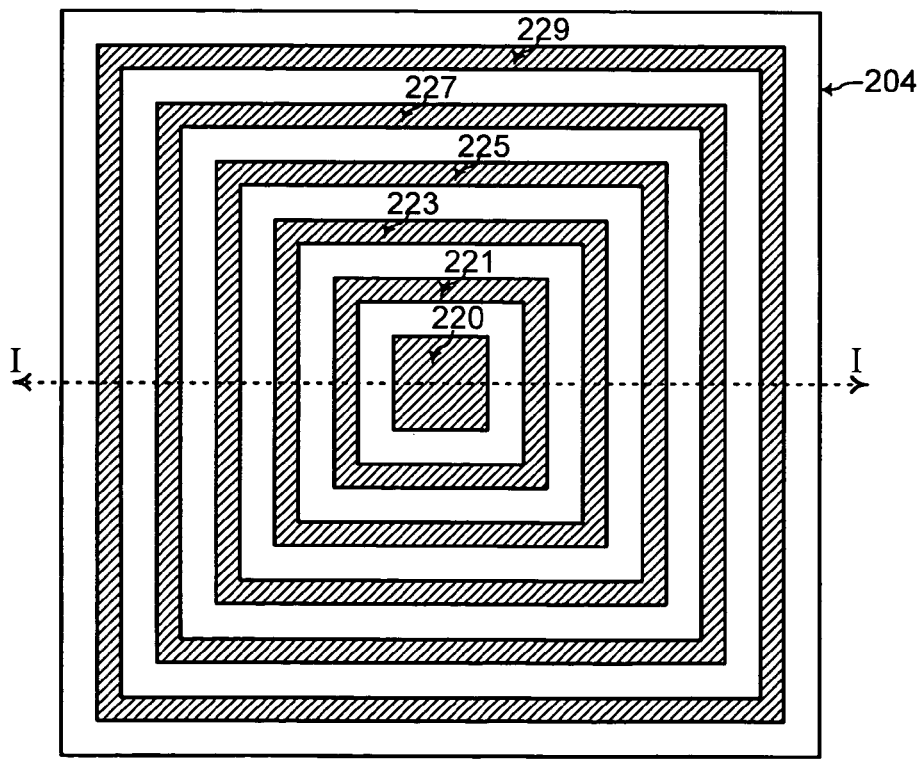
FIG. 3 shows a top view of frame electrodes within an electrostatic chuck of the lithography system of FIG. 2, according to an embodiment of the present invention.

In addition, the lithography system 200 includes an image reduction system 210 which reduces the image formed with reflected light 212 from the reticle 202 onto a semiconductor substrate 214. Referring to FIGS. 2 and 3, the electrostatic chuck 204 has a center electrode 220 and a plurality of frame electrodes 221, 223, 225, 227, and 229 embedded therein. FIG. 2 shows a cross-sectional view of the electrostatic chuck 204 across line I—I in FIG. 3.

In the example embodiment of FIG. 3, the electrostatic chuck 204 has a square shape, and the center electrode 220 also has a square shape and is disposed toward the center of the chuck 204. The plurality of frame electrodes 221, 223, 225, 227, and 229 each have a frame shape and are disposed successively from the center to the outer perimeter of the chuck 204.

Figure 5:
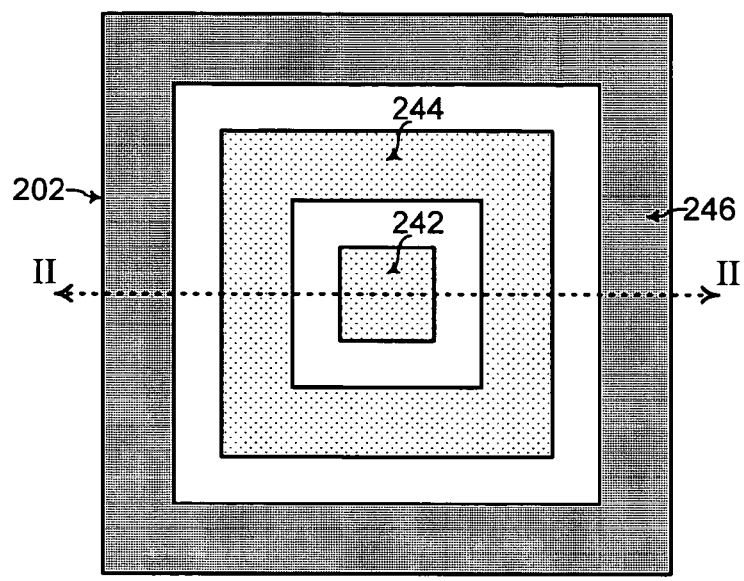

In addition, the reticle 202 has a plurality of coatings 242, 244, and 246 as illustrated by the shaded areas in FIG. 5. FIG. 2 shows a cross-sectional view of the reticle 202 across line II—II in FIG. 5. The plurality of coatings 242, 244, and 246 are comprised of an electrically conductive material such as a metal for example. FIG. 5 shows a top view of the reticle 202 that has a square shape concentric within the square shape of the chuck 204 in one embodiment of the present invention.

Each of the coatings 242, 244, and 246 of the reticle 202 faces a pair of electrodes of the electrostatic chuck 204. A center coating 242 of the reticle 202 faces a first pair of electrodes comprised of the center electrode 220 and the first frame electrode 221 of the chuck 204. A first frame coating 244 of the reticle 202 faces a second pair of electrodes comprised of the second frame electrode 223 and the third frame electrode 225 of the chuck 204.

Similarly, a second frame coating 246 of the reticle 202 faces a third pair of electrodes comprised of the fourth frame electrode 227 and the fifth frame electrode 229 of the chuck 204. The center coating 242 has a square shape and is disposed at the center of the reticle 202. The first and second frame coatings 244 and 246 each have a frame shape and are disposed successively from the center to the outer perimeter of the reticle 202.

Further referring to FIG. 2, the lithography system 200 also includes a voltage source 224 coupled to each of the center electrode 220 and the plurality of frame electrodes 221, 223, 225, 227, and 229 of the chuck 204. A data processor with a timer 226 is coupled to the voltage source 224 for controlling operation of the voltage source 224. A voltage source for generating voltage and a data processor with a timer for acting as a controller are each in general individually known to one of ordinary skill in the art.

For flattening the reticle 202 against the electrostatic chuck 204, the data processor 226 controls the voltage source 224 to apply a voltage difference across the pairs of electrodes within the electrostatic chuck 204 at variable times. The voltage source applies approximately 0 Volts at one electrode of a pair and applies a highly positive or negative voltage such as ±500 Volts or ±5,000 Volts for example at the other electrode of the pair. The magnitude of the highly positive or negative voltage depends on various factors such as the material and thickness of the reticle 202 and the material and thickness of the coatings 242, 244, and 246.

When such a high voltage difference is applied across a pair of electrodes, one of the coatings 242, 244, and 246 of the reticle 202 facing such a pair of electrodes becomes clamped to the electrostatic chuck 204 by electrostatic force. (The conductive coatings 242, 244, and 246 of the reticle 202 are not shown in the side views of FIGS. 4, 6, 8, 10, and 12 for ease and clarity of illustration.)

Figure 4:
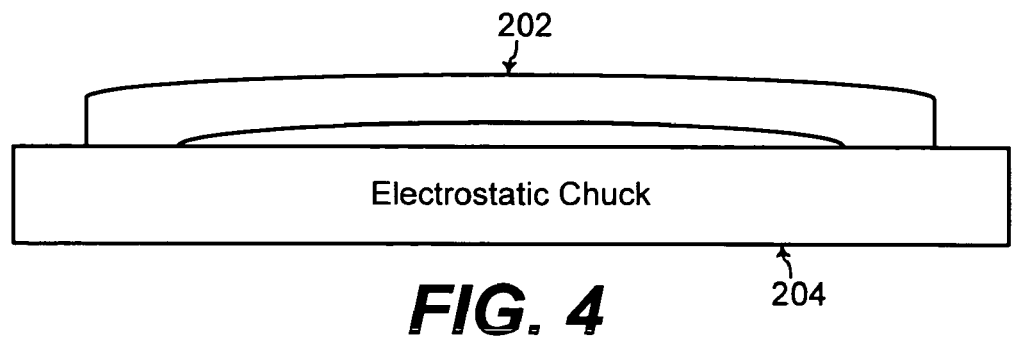
FIGS. 4–13 show side and top views of the reticle as different locations of the reticle are clamped to the electrostatic chuck of FIG. 3 with time to flatten the reticle, according to embodiments of the present invention.

Initially, each of the electrodes 220, 221, 223, 225, 227, and 229 is grounded to a voltage of 0 Volts for example from the voltage source 224 such that there is no potential difference across any of the pairs of electrodes. Referring to FIGS. 2, 3, and 4 in one example embodiment, at a first time point, the data processor 226 controls the voltage source 224 to apply +500 Volts to the fourth frame electrode 227 while the other electrodes 220, 221, 223, 225, and 229 remain grounded to 0 Volts.

Thus, a voltage difference of 500 Volts is developed across the third pair of electrodes 227 and 229 of the chuck 204. Referring to FIGS. 4 and 5, a first area of the second frame coating 246 faces the third pair of electrodes 227 and 229. The second frame coating 246 of the reticle 202 is toward the outer perimeter of the reticle 202 and is clamped to the electrostatic chuck 204 from the large voltage difference across the third pair of electrodes 227 and 229. FIG. 4 shows a side view of the reticle 202 and the chuck 204 after the first time point. FIG. 5 shows a top view of the reticle 202 having the first area of the second frame coating 246 illustrated with a darker shade in FIG. 5 as being clamped to the chuck 204 after the first time point.

Figure 6:
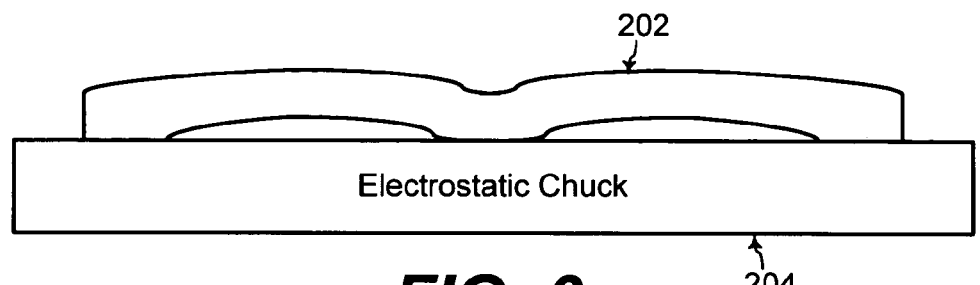

Thereafter, referring to FIG. 6, at a second time point after the first time point, the data processor 226 controls the voltage source 224 to apply +500 Volts to the center electrode 220 and the fourth frame electrode 227 while the other electrodes 221, 223, 225, and 229 remain grounded to 0 Volts. The data processor 226 controls the voltage source 224 to constantly apply +500 Volts to the fourth frame electrode 227 from the first time point to the second time point and to begin applying +500 Volts to the center electrode 220 at the second time point, whereas the other electrodes 221, 223, 225, and 229 all the while remain grounded to 0 Volts.

Figure 7:
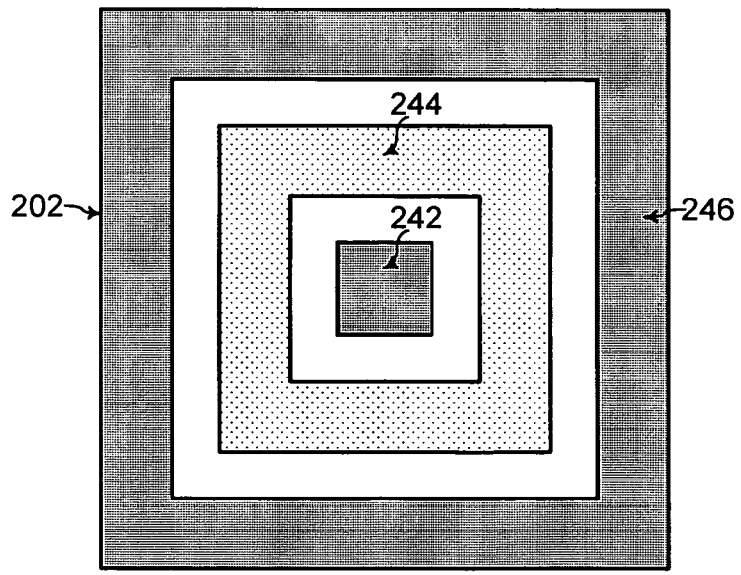

Thus, at the second time point, a voltage difference of 500 Volts is developed across the first pair of electrodes 220 and 221 additionally to the third pair of electrodes 227 and 229. Referring to FIGS. 6 and 7, a second area of the center coating 242 of the reticle 202 faces the first pair of electrodes 220 and 221 and is clamped to the electrostatic chuck 204 from the large voltage difference developed across the first pair of electrodes 220 and 221 at the second time point. FIG. 6 shows a side view of the reticle 202 and the chuck 204 after the second time point. FIG. 7 shows a top view of the reticle 202 having the first and second areas of the second frame coating and the center coating, 246 and 242, respectively, illustrated with a darker shade in FIG. 7 as being clamped to the chuck 204 after the second time point.

In the examples of FIGS. 4, 5, 6, and 7, the first area of the second frame coating 246 toward the outer perimeter of the reticle 202 is clamped to the chuck 204 before the second area of the center coating 242 is clamped to the chuck 204. As a result, when the center coating 242 is subsequently clamped, the outer perimeter of the reticle 202 cannot slide outward in FIG. 6. Thus, the reticle 202 does not become completely flattened in FIG. 6.

FIGS. 8–13 illustrate another embodiment for more completely flattening the reticle 202 by clamping the reticle 202 from a center area toward the outer perimeter with time. Referring to FIGS. 2 and 3 initially, each of the electrodes 220, 221, 223, 225, 227, and 229 is grounded to a voltage of 0 Volts for example from the voltage source 224 such that there is no potential difference across any of the pairs of electrodes. Then, referring to FIG. 8, at a first time point, the data processor 226 controls the voltage source 224 to apply +500 Volts to the center electrode 220 while the other electrodes 221, 223, 225, 227, and 229 remain grounded to 0 Volts.

Figure 8:
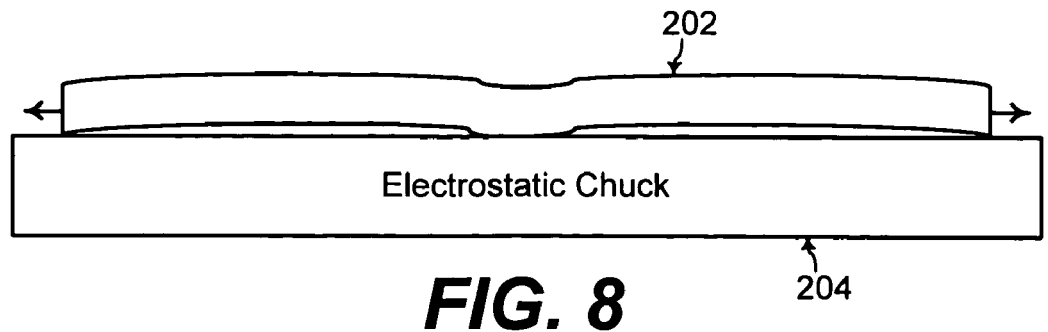
Figure 9:
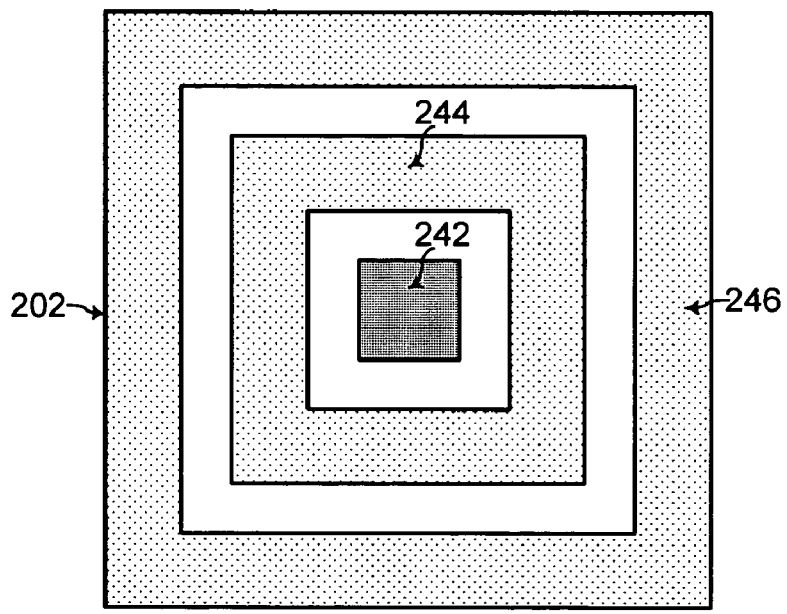

Thus, a voltage difference of 500 Volts is developed across the first pair of electrodes 220 and 221. In FIG. 9, a first area of the center coating 242 of the reticle 202 faces the first pair of electrodes 220 and 221 and is clamped to the electrostatic chuck 204 from the large voltage difference developed across the first pair of electrodes 220 and 221. FIG. 8 shows a side view of the reticle 202 and the chuck 204 after the first time point.

FIG. 9 shows a top view of the reticle 202 having the first area of the center coating 242 illustrated with a darker shade as being clamped to the chuck 204 after the first time point. Referring to FIGS. 8 and 9, because areas toward the outer perimeter of the reticle 202 are not yet clamped to the electrostatic chuck 204, the reticle 202 flattens by sliding outward toward the outer perimeter of the reticle 202 (as illustrated by the arrows in FIG. 8) when the center coating 242 of the reticle 202 is clamped to the electrostatic chuck 204 in FIG. 8.

Thereafter referring to FIGS. 2, 3, 10, and 11, at a second time point after the first time point, the data processor 226 controls the voltage source to apply +500 Volts to the center electrode 220 and the second frame electrode 223 while the other electrodes 221, 225, 227, and 229 remain grounded to 0 Volts. The data processor 226 controls the voltage source to constantly apply +500 Volts to the center electrode 220 from the first time point to the second time point and to begin applying +500 Volts to the second frame electrode 223 at the second time point, whereas the other electrodes 221, 225, 227, and 229 all the while remain grounded to 0 Volts.

Figure 10:
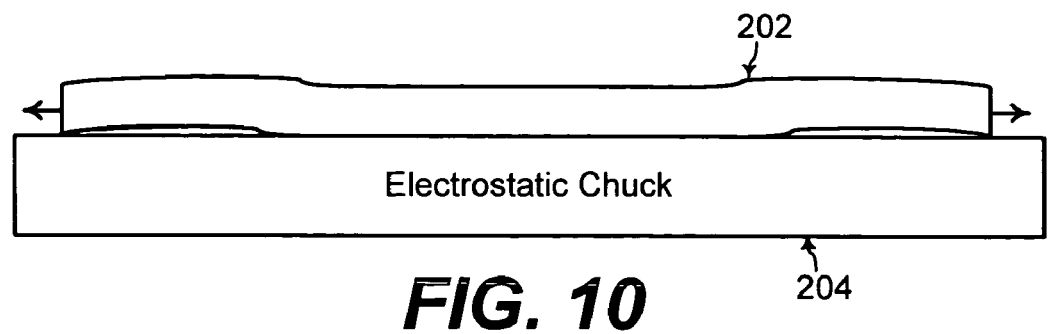
Figure 11:
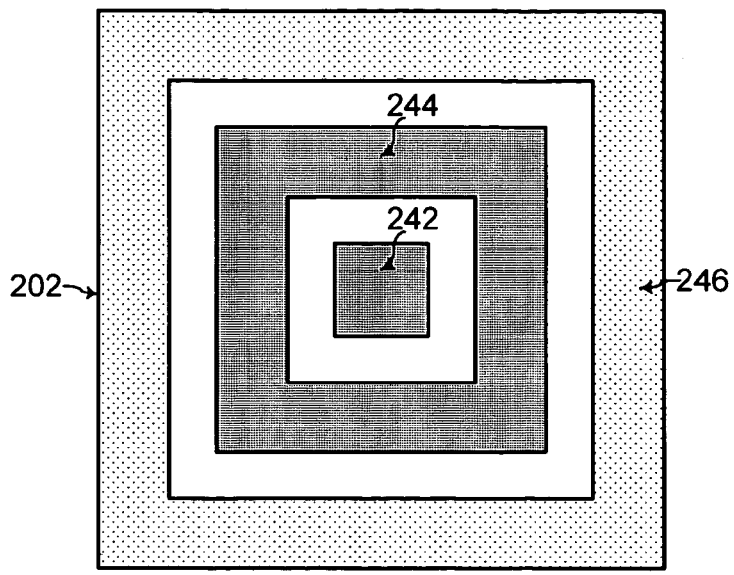

Thus, at the second time point, a voltage difference of 500 Volts is developed across the second pair of electrodes 223 and 225 additionally to the first pair of electrodes 220 and 221. Referring to FIGS. 10 and 11, a second area of the first frame coating 244 of the reticle 202 is a frame that is more outward toward the perimeter of the reticle 202 from the center coating 242. The second area of the first frame coating 244 of the reticle 202 faces the second pair of electrodes 223 and 225 and is clamped to the electrostatic chuck 204, additionally to the first area of the center coating 242, from the large voltage difference across the second pair of electrodes 223 and 225.

FIG. 10 shows a side view of the reticle 202 and the chuck 204 after the second time point. FIG. 11 shows a top view of the reticle 202 having the first and second areas of the center coating 242 and the first frame coating 244 illustrated with a darker shade as being clamped to the chuck 204 after the second time point. In this case also, because areas toward the outer perimeter of the reticle 202 are not yet clamped to the electrostatic chuck 204, the reticle 202 further flattens by sliding more outward toward the outer perimeter of the reticle 202 (as illustrated by the arrows in FIG. 10) when the first frame coating 244 in addition to the center coating 242 of the reticle 202 is clamped to the electrostatic chuck 204 in FIG. 10.

Finally referring to FIGS. 2, 3, 12, and 13, at a third time point after the second time point, the data processor 226 controls the voltage source to apply +500 Volts to the center electrode 220, the second frame electrode 223, and the fourth frame electrode 227. The data processor 226 controls the voltage source 224 to constantly apply +500 Volts to the center electrode 220 from the first time point to the third time point, and constantly to the second frame electrode 223 from the second time point to the third time point. Then, the data processor 226 controls the voltage source 224 to begin applying +500 Volts to the fourth frame electrode 227 at the third time point.

Figure 12:
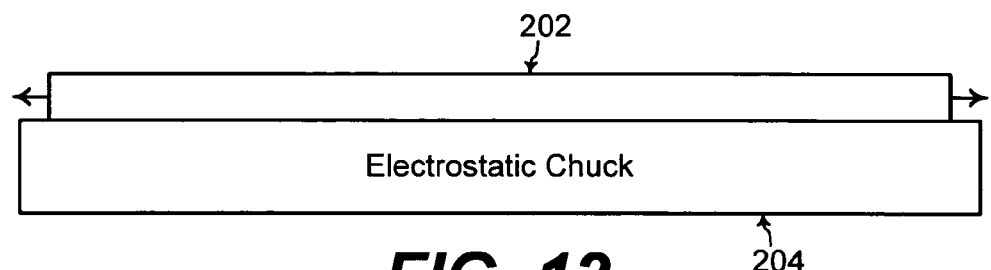
Figure 13:
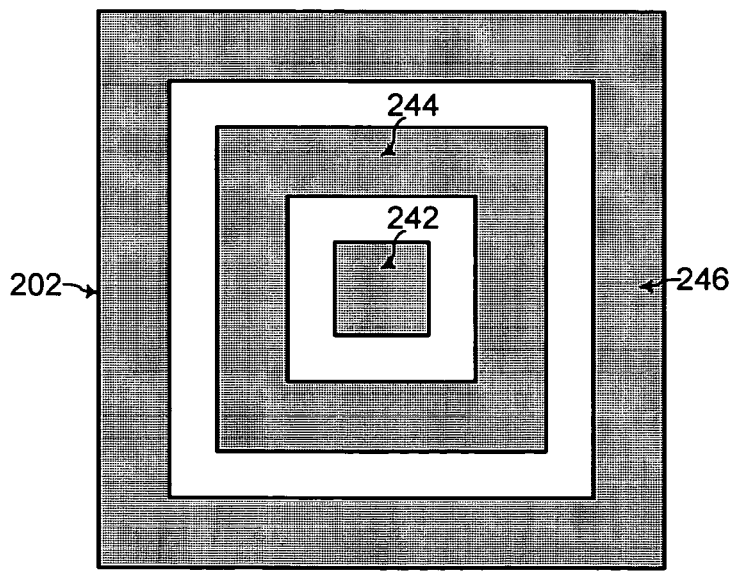

Referring to FIGS. 12 and 13, a third area of the second frame coating 246 of the reticle 202 is more outward toward the perimeter of the reticle 202 from the first frame coating 244. The second frame coating 246 of the reticle 202 faces the third pair of electrodes 227 and 229 and is clamped to the electrostatic chuck 204, along with the center coating 242 and the first frame coating 244, from the large voltage difference across the third pair of electrodes 227 and 229.

FIG. 12 shows a side view of the reticle 202 and the chuck 204 after the third time point. FIG. 13 shows a top view of the reticle 202 having the center coating 242 and the first and second frame coatings 244 and 246 illustrated with a darker shade as being clamped to the chuck 204 after the third time point. The reticle 202 has slid outward toward the perimeter to be significantly flattened by the time the third area of the second frame coating 246 toward the outer perimeter of the reticle 202 is clamped to the electrostatic chuck 204 in FIG. 12.

In this manner, the reticle 202 is flattened as variable areas of the reticle 202 are clamped to the electrostatic chuck 204 successively in time. In FIGS. 8–13, the center area 242 of the reticle 202 is clamped first, and each of the plurality of frames 244 and 246 of the reticle 202 is clamped to the chuck successively in time from the center to the outer perimeter of the reticle 202. Because areas of the reticle 202 are successively clamped from the center to the outer perimeter of the reticle 202, the reticle 202 slides outward toward the perimeter during such time variable clamping to be flattened against the chuck 204. With such a flattened reticle 202, image placement error on the semiconductor substrate 214 is advantageously minimized within the lithography system 200.

The foregoing is by way of example only and is not intended to be limiting. For example, the present invention is described for clamping the reticle 202 to an electrostatic chuck 204 using electrostatic force. However, the present invention may advantageously be applied for other types of chucks using other types of forces for clamping the reticle. Also, the present invention may advantageously be applied for flattening other types of warping of the reticle 202 aside from just the example bowing illustrated in FIG. 2.

In addition, the materials described herein are by way of example only. Furthermore, any numbers specified herein are by way of example only. For example, the present invention may be practiced with any number of electrodes of the chuck 204 and of the coatings of the reticle 202 disposed successively toward the outer perimeter. A typical electrostatic chuck and reticle are likely to have more numerous pairs of electrodes and coatings than the three illustrated and described herein for clarity and simplicity of illustration and description.

Also, the present invention may be practiced with any type of shape of the reticle 202 and the electrostatic chuck 204 aside from the example square shape illustrated and described herein. For example, the reticle 202 and the electrostatic chuck 204 may also have a circular shape. In any case, the reticle 202 may be flattened by successively clamping areas from the center toward the outer perimeter of the reticle.

The present invention is limited only as defined in the following claims and equivalents thereof.

We claim:

1. A method for clamping a reticle within a lithography system, comprising:

clamping a first area of the reticle to a chuck of the lithography system at a first time point;

clamping a second area of the reticle to the chuck at a second time point after the first time point such that the reticle is flattened against the chuck;

wherein the chuck is an electrostatic chuck having a first pair of electrodes and a second pair of electrodes, applying a voltage difference across the first pair of electrodes facing a first coating at the first area of the reticle at the first time point for clamping the first area to the chuck; and applying a voltage difference across the second pair of electrodes facing a second coating at the second area of the reticle at the second time point for clamping the second area to the chuck.

2. The method of claim 1, wherein the lithography system uses extreme ultraviolet light having a wavelength in a range of from about 110 Å to about 150 Å.

3. The method of claim 1, wherein light reflected from the reticle is used for patterning material on a semiconductor wafer within the lithography system.

4. The method of claim 1, wherein the first area is toward a center of the reticle, and wherein the second area is toward an outer perimeter of the reticle.

5. The method of claim 1, wherein the reticle has a square shape, and wherein the first area is disposed at a center of the reticle, and wherein the second area is a frame disposed toward an outer perimeter of the reticle.

6. The method of claim 1, wherein the first area is at a center of the reticle that has a square shape, and wherein the method further comprises:

clamping each of a plurality of frames of the reticle to the chuck successively in time from the center toward an outer perimeter of the reticle.

7. A system for clamping a reticle within a lithography system, comprising:

means for clamping a first area of the reticle to a chuck of the lithography system at a first time point;

means for clamping a second area of the reticle to the chuck at a second time point after the first time point such that the reticle is flattened against the chuck;

wherein the chuck is an electrostatic chuck having a first pair of electrodes and a second pair of electrodes, means for applying a voltage difference across the first pair of electrodes facing a first coating at the first area of the reticle at the first time point for clamping the first area to the chuck; and means for applying a voltage difference across the second pair of electrodes facing a second coating at the second area of the reticle at the second time point for clamping the second area to the chuck.

8. The system of claim 7, wherein the lithography system uses extreme ultraviolet light having a wavelength in a range of from about 110 Å to about 150 Å.

9. The system of claim 7, wherein light reflected from the reticle is used for patterning material on a semiconductor wafer within the lithography system.

10. The system of claim 7, wherein the first area is toward a center of the reticle, and wherein the second area is toward an outer perimeter of the reticle.

11. The system of claim 7, wherein the reticle has a square shape, and wherein the first area is disposed at a center of the reticle, and wherein the second area is a frame disposed toward an outer perimeter of the reticle.

12. The system of claim 7, wherein the first area is at a center of the reticle that has a square shape, the system further comprising:

means for clamping each of a plurality of frames of the reticle to the chuck successively in time from the center toward an outer perimeter of the reticle.

13. A lithography system comprising:

an electrostatic chuck having a first pair of electrodes and a second pair of electrodes;

a reticle having a first coating and a second coating facing the chuck;

a voltage source; and a data processor that controls the voltage source to apply a voltage difference across the first pair of electrodes facing the first coating at a first area of the reticle at a first time point for clamping the first area to the chuck, and that controls the voltage source to apply a voltage difference across the second pair of electrodes facing the second coating at a second area of the reticle at a second time point for clamping the second area to the chuck, such that the reticle is flattened against the chuck.

14. The lithography system of claim 13, wherein the first area is toward a center of the reticle, and wherein the second area is toward an outer perimeter of the reticle.

15. The lithography system of claim 13, wherein the reticle has a square shape, and wherein the first area is disposed at a center of the reticle, and wherein the second area is a frame disposed toward an outer perimeter of the reticle.

16. The lithography system of claim 13, wherein the lithography system uses extreme ultraviolet light having a wavelength in a range of from about 110 Å to about 150 Å.

17. The lithography system of claim 13, wherein light reflected from the reticle is used for patterning material on a semiconductor wafer within the lithography system.

* * * * *